United States Patent
Pohl et al.

(10) Patent No.: US 6,377,460 B1
(45) Date of Patent: Apr. 23, 2002

(54) ELECTRONIC CIRCUIT HAVING A FLEXIBLE INTERMEDIATE LAYER BETWEEN ELECTRONIC COMPONENTS AND A HEAT SINK

(75) Inventors: Jens Pohl, Bernhardswald; Gerolf Thamm, Dresden; Andreas Hippe, Pappritz, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/583,131

(22) Filed: May 30, 2000

(30) Foreign Application Priority Data

May 27, 1999 (DE) .......................................... 199 24 289

(51) Int. Cl.[7] .............................................. H05K 7/20
(52) U.S. Cl. ..................... 361/704; 361/707; 361/719; 361/722; 165/80.3; 174/16.3; 257/707
(58) Field of Search ................................ 361/770, 774, 361/777, 700–710, 712–722; 257/706–727, 686; 174/16.3, 252, 266; 165/80.2, 80.3, 185, 165, 80.04; 29/890.03

(56) References Cited

U.S. PATENT DOCUMENTS

| | | | | |
|---|---|---|---|---|
| 4,226,281 A | * | 10/1980 | Chu ........................... 165/185 |
| 4,654,754 A | * | 3/1987 | Daszkowski ................ 361/388 |
| 4,714,953 A | * | 12/1987 | Buller et al. ................... 357/81 |
| 4,838,347 A | * | 6/1989 | Dentini et al. .............. 165/185 |
| 4,993,482 A | * | 2/1991 | Dolbear et al. ............. 165/80.2 |
| 5,014,777 A | * | 5/1991 | Sano ........................... 165/185 |
| 5,213,868 A | * | 5/1993 | Liberty et al. ............... 428/131 |
| 5,557,501 A | | 9/1996 | DiStefano et al. |
| 5,650,914 A | * | 7/1997 | DiStefano et al. .......... 361/704 |
| 5,738,936 A | * | 4/1998 | Hanrahan ................ 428/313.5 |
| 5,785,799 A | | 7/1998 | Culnane et al. |
| 5,895,799 A | | 4/1999 | Wu et al. |
| 5,950,066 A | * | 9/1999 | Hanson et al. .............. 428/551 |
| 6,037,659 A | * | 3/2000 | Weixel ........................ 257/717 |
| 6,043,985 A | * | 3/2000 | Azdasht et al. ............. 361/707 |
| 6,064,573 A | * | 5/2000 | Morton ........................ 361/704 |
| 6,127,724 A | * | 10/2000 | DiStefano .................... 257/675 |

* cited by examiner

Primary Examiner—Leo P. Picard
Assistant Examiner—Michael Datskovsky
(74) Attorney, Agent, or Firm—Herbert L. Lerner; Laurence A. Greenberg; Werner H. Stemer

(57) ABSTRACT

An electronic circuit module has at least one electronic component and a heat sink, which is thermally connected to the at least one electronic component. A thermal conduction path between the at least one electronic component and the heat sink is formed by an intermediate layer, which adjoins a surface of the heat sink. The intermediate layer is formed by an island-like structure including pillars of a flexible, thermally conductive material.

13 Claims, 4 Drawing Sheets

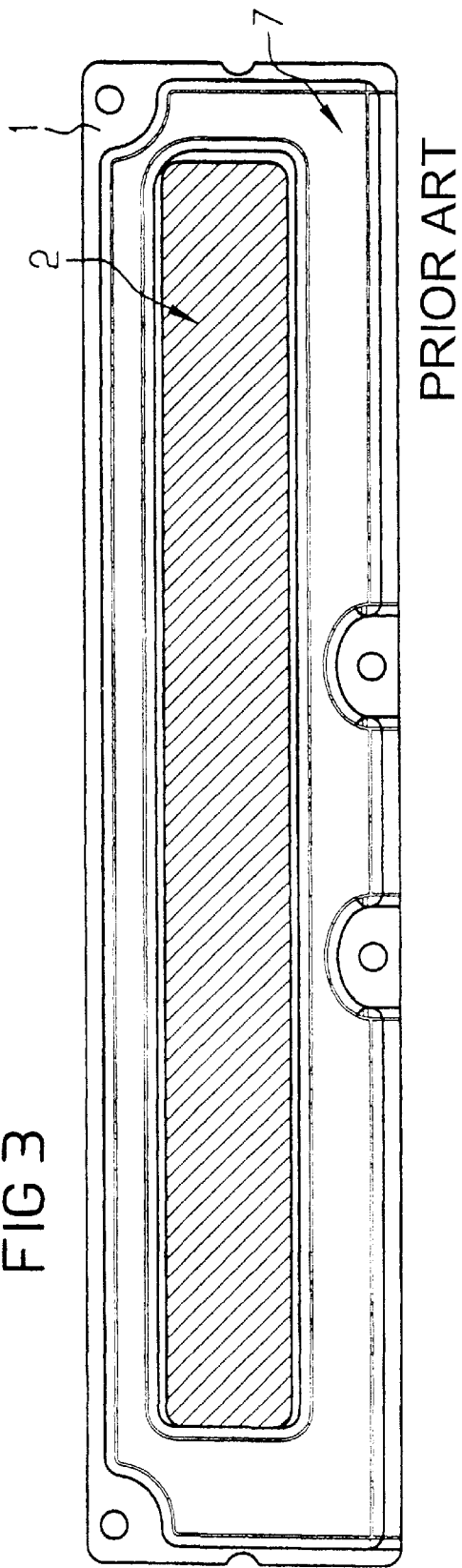
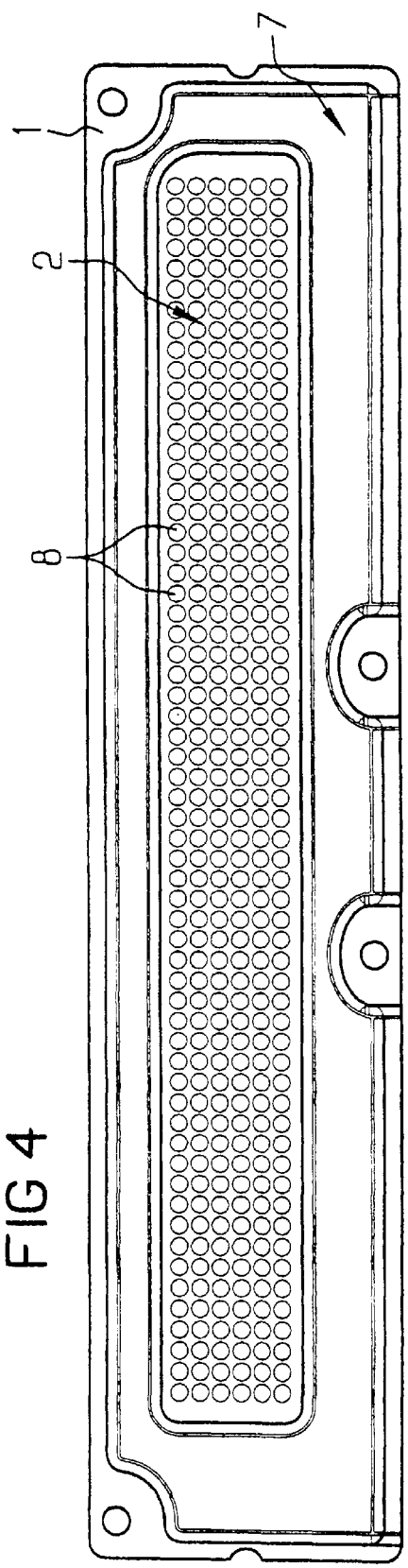

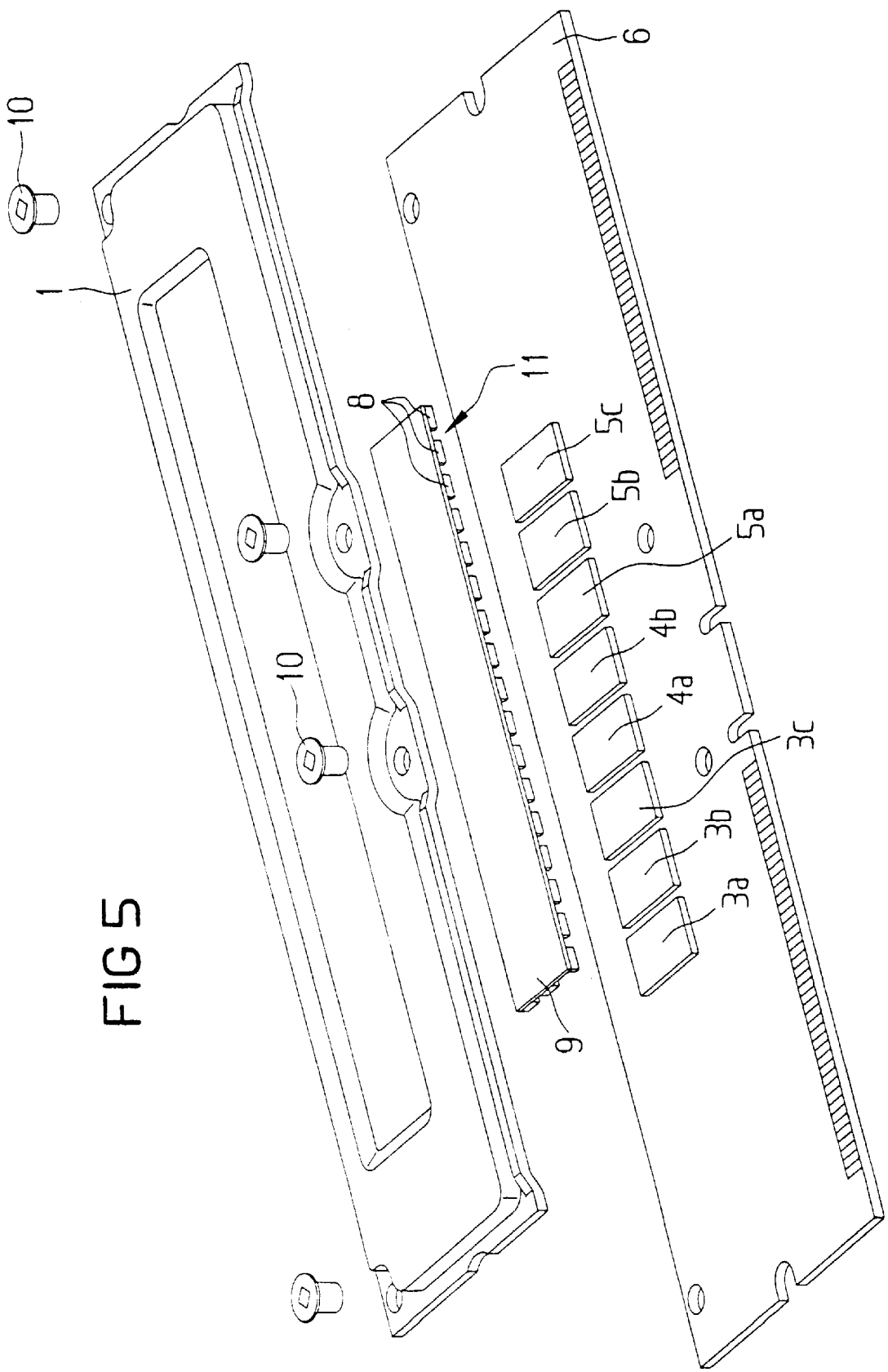

ELECTRONIC CIRCUIT HAVING A FLEXIBLE INTERMEDIATE LAYER BETWEEN ELECTRONIC COMPONENTS AND A HEAT SINK

BACKGROUND OF THE INVENTION

FIELD OF THE INVENTION

The present invention relates to an electronic circuit module having at least one electronic component and a heat sink, which is thermally connected to the at least one electronic component. An intermediate layer is provided between the electronic component and the heat sink, with the result that a thermal conduction path is formed between the at least one electronic component and the heat sink. The intermediate layer adjoins a first surface of the heat sink.

Such a configuration is in principle known from U.S. Pat. No. 5,895,799. However, such a configuration is only inadequately suited to compensate for production tolerances and different thicknesses of the individual components in such an electronic circuit module. Also, this conventional configuration cannot guarantee a sufficient thermal connection between the electronic components and the heat sink. This is illustrated diagrammatically in FIG. 1. The electronic circuit module illustrated in FIG. 1 has three electronic components 3, 4, 5, which are mounted onto a carrier 6, for example a printed circuit board. A thermal conduction path to a heat sink 1 is established via an intermediate layer 2. However, if, as shown in FIG. 1, one of the electronic components, such as in this case the component 4, has for example a smaller height than the other electronic components 3, 5, then the continuous intermediate layer 2 can compensate for these height differences only inadequately, or not at all, with the result that only an inadequate thermal connection, or no thermal connection at all, can be established between the electronic component 4 and the heat sink 1.

U.S. Pat. No. 5,557,501 describes a configuration including two boundary layers configured in a partially flexible manner. Thermally conductive spring elements are provided between the boundary layers which can be introduced between a heat sink and electronic components in order to compensate for height tolerances of the electronic components and to establish a thermal connection between the components and the heat sink. However, forming such a thermal connection necessitates connecting different layers to one another in a complicated production method. As a result of this, thermal contact resistances are produced at each of the interfaces, that reduce the efficiency of the thermal connection. Furthermore, the production of such a structure requires the use of expensive materials and requires several photo and patterning processes, which likewise make the structure more expensive to produce.

SUMMARY OF THE INVENTION

It is accordingly an object of the invention to provide a configuration which overcomes the above-mentioned disadvantages of the heretofore-known configurations of this general type and which guarantees an improved thermal connection between electronic components of a circuit module and a heat sink.

With the foregoing and other objects in view there is provided, in accordance with the invention, an electronic circuit module, including:
  at least one electronic component;
  a heat sink having a surface and being thermally connected to the at least one electronic component;
  pillars formed of a flexible, thermally conductive material, the pillars forming an island-like structure as an intermediate layer adjoining the surface of the heat sink, the pillars establishing a thermal conduction path between the at least one electronic component and the heat sink.

In other words, a first embodiment of the present invention provides an electronic circuit module in which an intermediate layer between electronic components and a heat sink is configured in such a way that it has an island-like structure formed from pillars of a flexible, thermally conductive material. The advantage of such a structure is that it can compensate much better for production tolerances and height differences within the electronic circuit module and, consequently, can guarantee a good thermal connection between each electronic component of the circuit module and the heat sink. By way of example, the island-like configuration of the pillars allows the pillars to be compressed to a greater extent in the region of higher components, in which case the flexible material (in contrast to a continuous, flexible layer) can then yield into the interspaces of the island-like structure, that is to say into the interspaces between the pillars, and thus fill the interspaces to a large extent. The flexible material of such an island-like structure can thus be compressed to a significantly higher degree in the region of higher components and, consequently, can compensate for significantly larger height differences. This ensures that the intermediate layer can also be pressed onto electronic components having a relatively small height within the circuit module, thereby guaranteeing a thermal connection even to these components.

With the objects of the invention in view there is also provided, a heat sink configuration for an electronic circuit module with at least one electronic component, including:
  a heat sink having a surface; and
  a coating provided at least on the surface, the coating being formed of pillars of a flexible, thermally conductive material, and the pillars forming an island-like structure.

In accordance with another feature of the invention, the island-like structure has a first total cross-sectional area parallel to the surface. The pillars have, when the heat sink is in a mounted position, a second total cross-sectional area parallel to the surface, and the second total cross-sectional area is between 50% and 90% of the first total cross-sectional area.

With the objects of the invention in view there is also provided, in combination with an electronic circuit module having at least one electronic component, a heat sink configuration which includes a heat sink having a surface; a coating provided at least on the surface, the coating being formed of pillars of a flexible, thermally conductive material, the pillars forming an island-like structure; the island-like structure having a first total cross-sectional area parallel to the surface, the pillars having, in a region between the at least one electronic component and the heat sink, a second total cross-sectional area parallel to the surface; and the pillars and the island-like structure have a given geometry selected such that, after the heat sink is mounted onto the electronic circuit module, the second total cross-sectional area is between 50% and 90% of the first total cross-sectional area.

With the objects of the invention in view there is further provided, a carrier sheet configuration, including a carrier sheet having a surface; and a coating provided at least on the surface, the coating being formed of pillars of a flexible, thermally conductive material, and the pillars forming an island-like structure.

In accordance with a further feature of the invention, the island-like structure has a first total cross-sectional area parallel to the surface and the pillars have a second total cross-sectional area parallel to the surface; and the pillars and the island-like structure have a given geometry selected such that, after compression of the flexible, thermally conductive material perpendicularly to the surface of the carrier sheet, the second total cross-sectional area is between 50% and 90% of the first total cross-sectional area.

As described above, U.S. Pat. No. 5,557,501 teaches a configuration which has a reduced thermal efficiency and which requires the use of expensive materials and several photo and patterning processes. The intermediate layer according to the invention, by contrast, can be produced cost effectively in a single process step, for example a printing process, wherein extremely inexpensive materials can be used. In such a printing process, specifically, the thermal contact resistance between the flexible material and the heat sink, for example, can additionally be advantageously decreased since, when the flexible material is printed onto the heat sink, the adhesion between the flexible material and the heat sink can additionally be increased.

The conventional configuration described in U.S. Pat. No. 5,557,501, furthermore requires a minimum structural height in order to obtain a sufficient spring action. However, if it is intended to obtain a smaller structural height, this can only be done by using springs having a smaller spring excursion, as a result of which the spring force and hence the contact pressure on the electronic components and also the heat sink generally decrease, which increases the thermal contact resistance at these interfaces. The intermediate layer according to the invention, on the other hand, still exhibits a sufficient contact pressure and hence a good thermal connection even in the case of extremely small structural heights.

Finally, the configuration according to U.S. Pat. No. 5,557,501 is highly susceptible to problems, in particular because the configuration is not very robust and also because it reacts very sensitively to shear forces. In contrast thereto, the intermediate layer according to the invention has no such problems.

The geometry of the pillars according to the invention, which are composed of the flexible, thermally conductive material, can in each case be adapted to the requirements within the electronic circuit module. In particular, the maximum possible or required contact pressure of the heat sink on the electronic components and also the flexibility of the flexible material are to be taken into account in this case. Moreover, the cross-sectional area of each individual pillar and also the total cross-sectional area of all the pillars in a plane parallel to that surface to which the intermediate layer is applied can be adapted in a manner dependent on the heat to be transported. Thus, by way of example, it may be provided that, in those regions in which the intermediate layer adjoins both the heat sink and an electronic component, the total cross-sectional area of the pillars, that is to say the total cross-sectional area of the flexible, thermally conductive material, is between 50% and 90% of the total cross-sectional area of the island-like structure, that is to say the total cross-sectional area of the flexible, thermally conductive material plus the area of the interspaces between the flexible, thermally conductive material. This ensures that the flexible material still has sufficient space to yield into the interspaces between the pillars, and, on the other hand, a sufficient thermal connection between the electronic components and the heat sink is guaranteed, which largely corresponds to the properties of a continuous intermediate layer between electronic components and the heat sink. As already explained above, the specific geometry of the pillars can have any suitable form. Thus, by way of example, the pillars may be configured to be largely quadrangular, that is to say square or rectangular, for example, or they may, for example, also have a largely round form, e.g. in the form of round or elliptical pillars or in the form of spheres. The pillars may have, in the direction perpendicularly away from the first surface, a constant cross-sectional area parallel to the first surface. This achieves, in particular, a linear "spring characteristic curve" of the pillars, that is to say a linear profile of the spring force resulting from a compression of the pillars as a function of the spring excursion, that is to say of the compression distance of the pillars perpendicularly to the first surface. As an alternative, the pillars may have, in the direction perpendicularly away from the first surface, a decreasing cross-sectional area, that is to say cross-sectional areas with a decreasing area, parallel to the first surface. In other words, the pillars then taper conically in the direction away from the surface on which they are applied, e.g. in the form of a cone or truncated cone or hemisphere. A nonlinear, progressive behavior of the spring characteristic curve is thus obtained, such that the spring force of the pillars increases more than linearly with increasing compression, that is to say with an increasing spring excursion.

As already mentioned, the intermediate layer can be produced by a printing method and can thus be produced directly on the heat sink, or alternatively on an electronic component. It may also be provided that a carrier sheet or carrier foil is provided with an island-like structure according to the invention made of a flexible, thermally conductive material. In this case, the carrier sheet can then be applied to a heat sink or an electronic component. However, such a carrier sheet may also be used in the context of any other application in which a thermal contact is intended between two or more structural parts of a respective configuration.

Other features which are considered as characteristic for the invention are set forth in the appended claims.

Although the invention is illustrated and described herein as embodied in an electronic circuit module having a flexible intermediate layer between electronic components and a heat sink, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a plan view of a conventional heat sink having a continuous intermediate layer applied thereon;

FIG. 4 is a plan view of a heat sink according to the invention having an island-like structure applied thereon as an intermediate layer;

FIG. 5 is an exploded, perspective view of an electronic circuit module including a carrier sheet according to the invention having a coating with an island-like structure;

DESCRIPTION OF THE PREFERRED EMBODIMENTS

Figure 1:
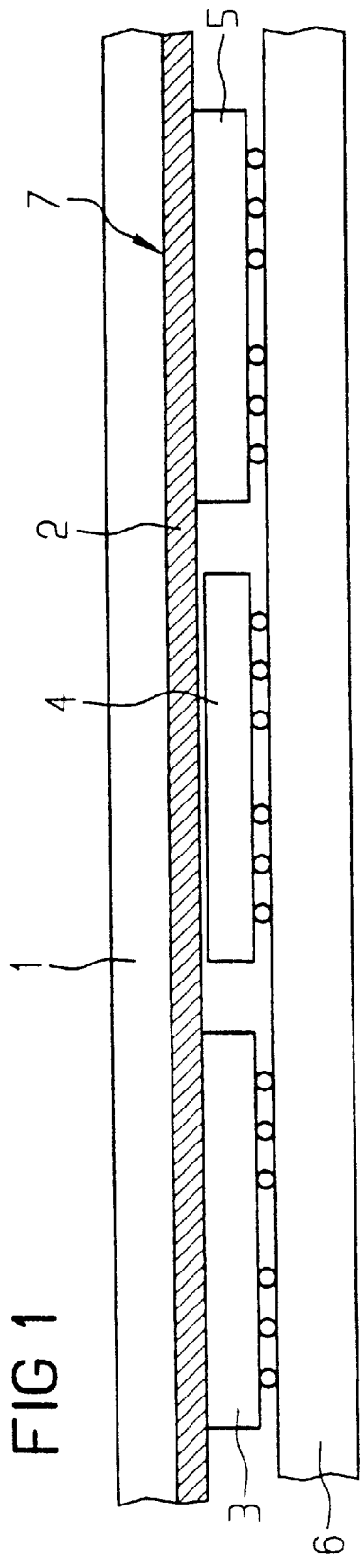
FIG. 1 is a diagrammatic, partial sectional view of a conventional electronic circuit module having a continuous intermediate layer between components and a heat sink.
Figure 2:
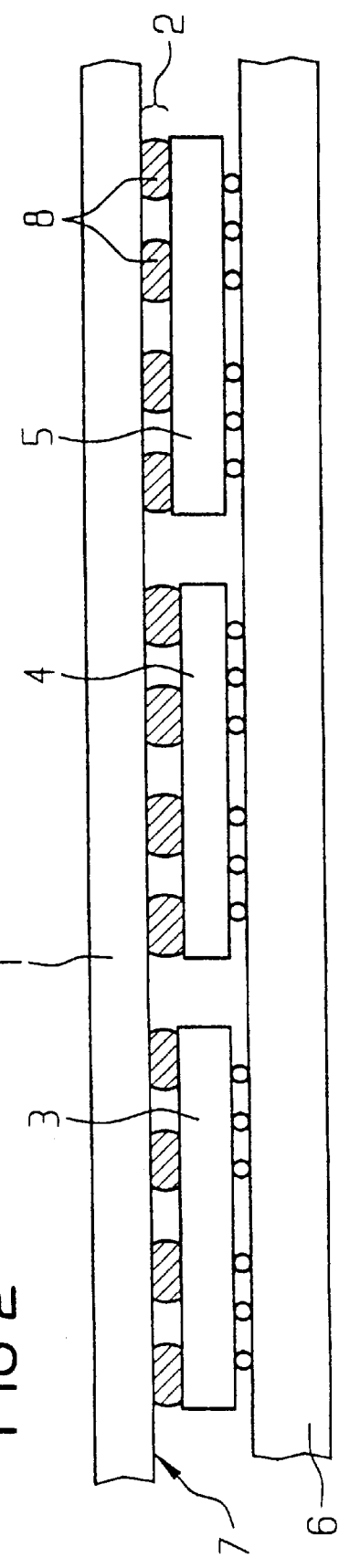
FIG. 2 is a diagrammatic, partial sectional view of an electronic circuit module having an island-like structure as an intermediate layer according to the invention.

Referring now to the figures of the drawings in detail and first, particularly, to FIG. 2 thereof, there is shown an intermediate layer according to the invention having an island-like structure, which eliminates the disadvantages of the intermediate layer from the prior art, as is illustrated in FIG. 1. FIG. 2 illustrates, by way of example, a plurality of electronic components 3, 4, 5 mounted onto a carrier 6, for example a printed circuit board. In this case, a component 4 has a smaller structural height than the rest of the components 3, 5. A heat sink 1 is provided above the components 3, 4, 5, an intermediate layer 2 made of a flexible, thermally conductive material being provided between the components 3, 4, 5 and the heat sink 1. This intermediate layer 2 adjoins a first surface 7 of the heat sink 1. In this case, the intermediate layer 2 is formed by an island-like structure, individual pillars 8 of the flexible, thermally conductive material being provided in such a way that there are interspaces remaining between the individual pillars 8. In the event of the pillars 8 being compressed by the heat sink 1 being pressed onto the components 3, 4, 5, the interspaces allow the flexible, thermally conductive material to yield into the interspaces between the individual pillars 8. As a result, the height differences between the individual components 3, 4, 5 can be better compensated for, since the intermediate layer 2 can be compressed to a greater extent by virtue of the flexible material yielding into the interspaces in the region of the components 3, 5. This compression also increases the cross-sectional area of the individual pillars 8 in the region of the electronic components 3, 4, 5, in each case in a manner dependent on the degree of compression of the individual pillars.

Figure 6:
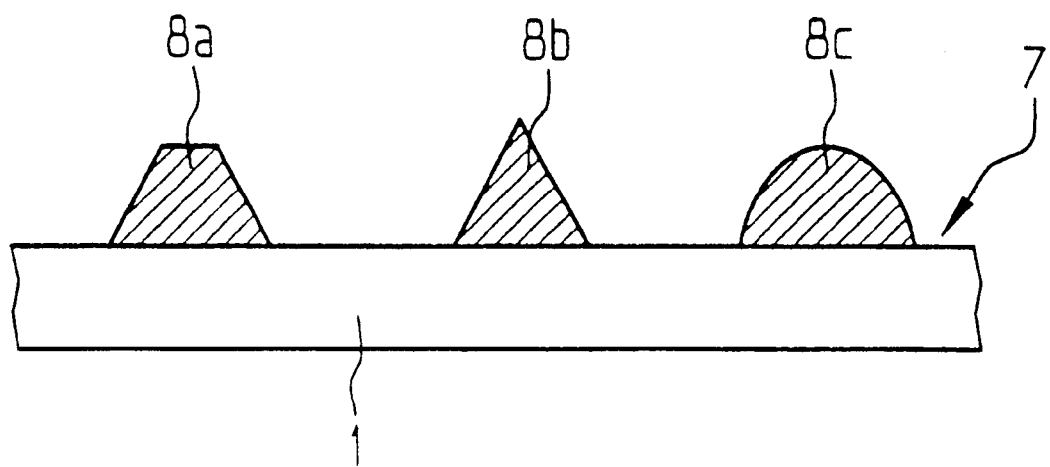
FIG. 6 is a diagrammatic, partial sectional view of a heat sink with pillars having a decreasing cross-sectional area.
Figure 7:
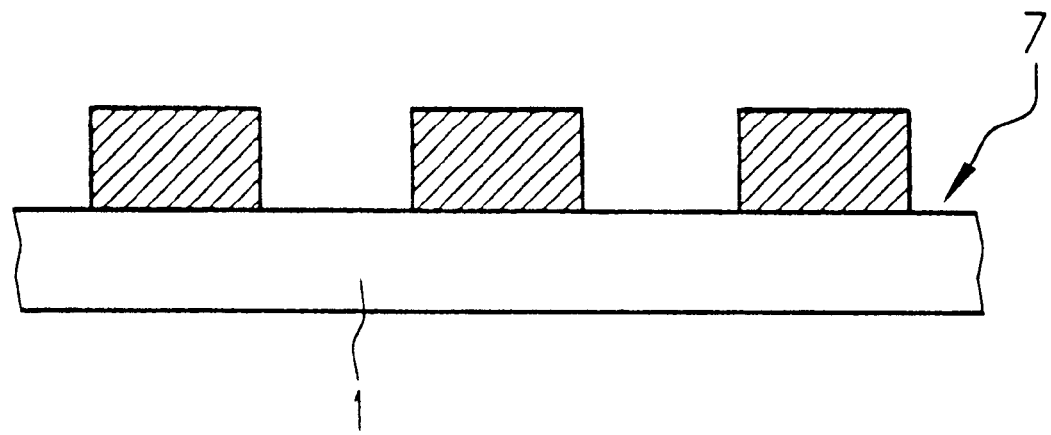
FIG. 7 is a diagrammatic, partial sectional view of a heat sink with pillars having a constant cross-sectional area.

The geometry of the pillars 8 and of the interspaces between the individual pillars 8 is ideally chosen in such a way that after the mounting of the circuit module has been completed, that is to say after compression of the pillars 8, the total cross-sectional area of the pillars 8, in the region of the components 3, 4, 5, is between 50% and 90% of the total cross-sectional area of the island-like structure, that is to say the total cross sectional area of the pillars 8 plus the area of the interspaces between the pillars. The respective cross-sectional areas are in this case determined parallel to the first surface 7 of the heat sink 1. The geometry of the cross-sectional areas can be varied in a suitable manner. Pillars 8 with quadrangular or round cross-sectional areas may be provided, for example. These cross-sectional areas may be constant perpendicular to the surface 7, as shown diagrammatically by FIG. 7. However, it is also possible to choose pillars 8 whose cross-sectional areas decrease away from the surface 7. Three examples of this are illustrated for comparison purposes in a joint FIG. 6. The latter shows a truncated cone 8a, a cone 8b and a hemisphere 8c as possible pillar forms, wherein all the pillars 8 ideally have an identical form for a particular configuration, e.g. all pillars in the form of a hemisphere 8c.

The intermediate layer 2, that is to say the island-like structure including the pillars 8, can be applied directly to a heat sink, for example by a printing method. Such a heat sink is illustrated in FIG. 4. The pillars 8 forming the intermediate layer 2 are in this case printed onto a first surface 7 of a heat sink 1. In contrast to this, FIG. 3 shows a heat sink 1 which has a continuous intermediate layer 2 on a first surface 7. As an alternative to this, however, the intermediate layer can also be applied to the components 3, 4, FIG. 5 shows a further alternative embodiment of the invention. A carrier sheet 9 is provided to which an island-like structure including pillars 8 is applied onto a first surface 11. Such a carrier sheet can be used wherever a thermal contact is to be provided between two planar areas of two structural parts. Thus, by way of example, this carrier sheet can be used in an electronic circuit module which has one or more electronic components 3a, 3b, 3c, 4a, 4b, 5a, 5b, 5c on a carrier 6. Furthermore, a heat sink or cooling device 1 is provided which is intended to be thermally connected to the components. To that end, the carrier sheet 9 is introduced between the heat sink 1 and the components. The heat sink 1 can be pressed onto the carrier 6 and thus onto the electronic components 3a, 3b, 3c, 4a, 4b, 5a, 5b, 5c through the use of screwed joints 10, for example. The carrier sheet 9 having an island-like structure including pillars 8 made of a flexible, thermally conductive material at least on a surface 11 of the carrier sheet is particularly suited to compensating for production tolerances or height differences in the circuit module, for example if some components 4a, 4b have a smaller structural height than the rest of the components 3a, 3b, 3c, 5a, 5b, 5c. In principle, the carrier sheet 9 can also have an island-like structure including pillars 8 on both surfaces.

We claim:

1. An electronic circuit module, comprising:
   at least one electronic component;
   a heat sink having a surface and being thermally connected to said at least one electronic component;
   a flexible, thermally conductive coating provided at least on said surface, said coating shaped into pillars, said pillars forming an island-like structure as an intermediate layer adjoining said surface of said heat sink, said pillars establishing a thermal conduction path between said at least one electronic component and said heat sink.

2. The electronic circuit module according to claim 1, wherein, between said at least one electronic component and said heat sink, said island-like structure has a first total cross-sectional area parallel to said surface, said pillars have a second total cross-sectional area parallel to said surface, and said second total cross-sectional area is between 50% and 90% of said first total cross-sectional area.

3. The electronic circuit module according to claim 1, wherein said pillars each have an essentially quadrangular cross-sectional area parallel to said surface.

4. The electronic circuit module according to claim 1, wherein said pillars each have an essentially round cross-sectional area parallel to said surface.

5. The electronic circuit module according to claim 1, wherein, in a direction perpendicularly away from said surface of said heat sink, said pillars each have a constant cross-sectional area parallel to said surface.

6. The electronic circuit module according to claim 1, wherein, in a direction perpendicularly away from said surface of said heat sink, said pillars each have a decreasing cross-sectional area parallel to said surface.

7. A heat sink configuration for an electronic circuit module with at least one electronic component, comprising:
   a heat sink having a surface; and
   a coating provided at least on said surface, said coating being formed of pillars of a flexible, thermally conductive material, and said pillars forming an island-like structure.

8. The heat sink configuration according to claim 7, wherein said island-like structure has a first total cross-sectional area parallel to said surface, said pillars have, when said heat sink is in a mounted position, a second total cross-sectional area parallel to said surface, and said second total cross-sectional area is between 50% and 90% of said first total cross-sectional area.

9. The heat sink configuration according to claim 7, wherein said pillars each have an essentially quadrangular cross-sectional area parallel to said surface.

10. The heat sink configuration according to claim 7, wherein said pillars each have an essentially round cross-sectional area parallel to said surface.

11. The heat sink configuration according to claim 7, wherein, in a direction perpendicularly away from said surface of said heat sink, said pillars each have a constant cross-sectional area parallel to said surface.

12. The heat sink configuration according to claim 7, wherein, in a direction perpendicularly away from said surface of said heat sink, said pillars each have a decreasing cross-sectional area parallel to said surface.

13. In combination with an electronic circuit module having at least one electronic component, a heat sink configuration, comprising:

a heat sink having a surface;

a coating provided at least on said surface, said coating being formed of pillars of a flexible, thermally conductive material, said pillars forming an island-like structure;

said island-like structure having a first total cross-sectional area parallel to said surface, said pillars having, in a region between the at least one electronic component and said heat sink, a second total cross-sectional area parallel to said surface; and said pillars and said island-like structure having a given geometry selected such that, after said heat sink is mounted onto the electronic circuit module, said second total cross-sectional area is between 50% and 90% of said first total cross-sectional area.

* * * * *

UNITED STATES PATENT AND TRADEMARK OFFICE
CERTIFICATE OF CORRECTION

PATENT NO. : 6,377,460 B1
DATED : April 23, 2002
INVENTOR(S) : Jens Pohl et al.

It is certified that error appears in the above-identified patent and that said Letters Patent is hereby corrected as shown below:

<u>Title page,</u>
Item [54], should read as follows: -- ELECTRONIC CIRCUIT MODULE HAVING A FLEXIBLE INTERMEDIATE LAYER BETWEEN ELECTRONIC COMPONENTS AND A HEAT SINK. --

Signed and Sealed this

Tenth Day of September, 2002

*Attest:*

*Attesting Officer*

JAMES E. ROGAN
*Director of the United States Patent and Trademark Office*